United States Patent
Matsubara

(10) Patent No.: US 7,831,939 B2
(45) Date of Patent: Nov. 9, 2010

(54) SEMICONDUCTOR INTEGRATED CIRCUIT DEVICE FEATURING PROCESSED MINIMUM CIRCUIT PATTERN, AND DESIGN METHOD THEREFOR

(75) Inventor: Yoshihisa Matsubara, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 419 days.

(21) Appl. No.: 11/950,549

(22) Filed: Dec. 5, 2007

(65) Prior Publication Data
US 2008/0148207 A1 Jun. 19, 2008

(30) Foreign Application Priority Data
Dec. 14, 2006 (JP) .............................. 2006-337489

(51) Int. Cl.
*G06F 17/50* (2006.01)
(52) U.S. Cl. .................. 716/4; 716/2; 716/5; 716/8
(58) Field of Classification Search ............ 716/1, 716/2, 4, 5, 8
See application file for complete search history.

(56) References Cited
U.S. PATENT DOCUMENTS
2002/0179941 A1* 12/2002 Ootake et al. ............... 257/210
2002/0185742 A1* 12/2002 Ootake et al. ............... 257/776

FOREIGN PATENT DOCUMENTS
JP 2005-62601 3/2005

* cited by examiner

*Primary Examiner*—Sun J Lin
(74) *Attorney, Agent, or Firm*—Young & Thompson

(57) ABSTRACT

In a semiconductor integrated circuit design method for carrying out a design of circuit patterns, a plurality of circuit patterns are defined, and each of the circuit patterns is composed of at least one minimum unit area. One of the circuit patterns is selected, and an expansion area is defined with respect to the selected circuit pattern so that the selected circuit pattern is at least included in the expansion area. An area ratio of an area size of the circuit pattern or circuit patterns included in the expansion area to an area size of the expansion area is calculated, and the area ratio is compared with a reference value.

16 Claims, 13 Drawing Sheets

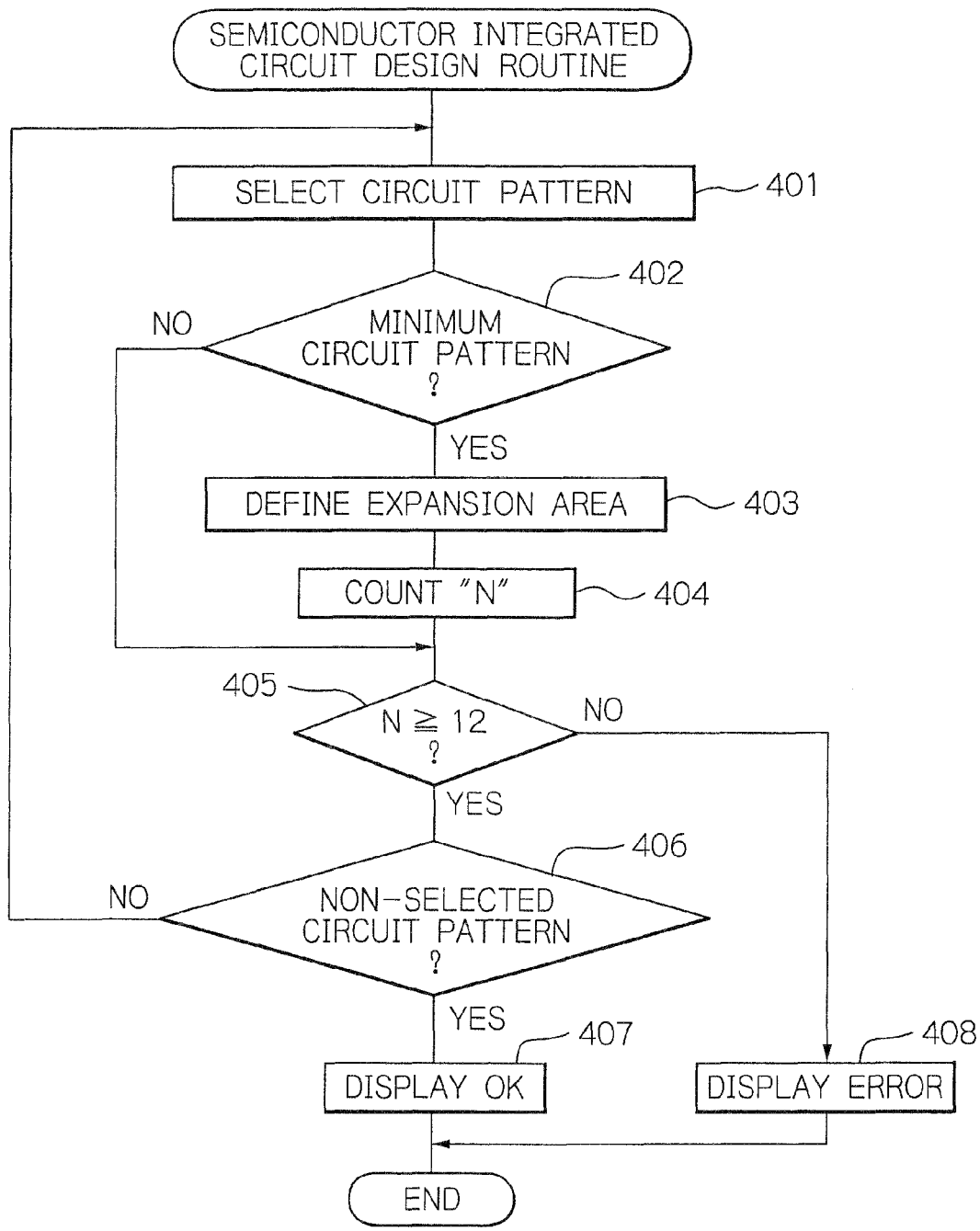

SEMICONDUCTOR INTEGRATED CIRCUIT DEVICE FEATURING PROCESSED MINIMUM CIRCUIT PATTERN, AND DESIGN METHOD THEREFOR

BACKGROUND OF THE INVENTION

1. Field of the Invention

The present invention relates to a semiconductor integrated circuit device and a design method for designing circuit patterns to be produced in the semiconductor integrated circuit device.

2. Description of the Related Art

In manufacturing a semiconductor integrated circuit device, an interconnection layer defining various circuit patterns is formed in each of insulating layers, which are formed on a substrate of a semiconductor integrated circuit device, by using a photolithography and etching method.

In particular, in the photolithography and etching method, first, a suitable metal layer is formed on an insulating layer on the substrate of the semiconductor integrated circuit device, and a photoresist layer is formed on the metal layer. Then, a photomask defining various circuit patterns is applied to the photoresist layer, and then an exposure process is executed. Namely, in the exposure process, the photomask is exposed to a light through a suitable optical lens system, so that the various circuit patterns are optically projected and transferred from the photomask to the photoresist layer.

Next, the photoresist layer is developed by a developing process so that a photoresist pattern layer carrying the transferred circuit patterns is formed on the metal layer. Then, the metal layer is subjected to an etching process, and is patterned due to the existence of the photoresist pattern layer, so that an interconnection layer defining the various circuit patterns is produced on the insulating layer on the substrate of the semiconductor integrated circuit device.

On the other hand, an interconnection layer may be formed in the insulating layer on the substrate of the semiconductor integrated circuit device by using a damascene process.

Recently, with the advance of miniaturization of semiconductor integrated circuit devices, the minimum line width of the interconnection layer to be produced has become increasingly smaller. In reality, an interconnection layer featuring a minimum line width of less than 90 nm has been produced on the insulating layer formed on the substrate of a semiconductor integrated circuit device.

In general, in the exposure process of the photolithography and etching method, when a fine part of the circuit patterns to be optically projected and transferred from the photomask to the photoresist layer has a line width of less than ½ wavelength of light, it is difficult to carry out the optical transfer of the fine part from the photomask to the photoresist layer with proper fidelity, because an adequate depth of focus cannot be obtained at the fine part having the line width of less than ½ wavelength of light.

Various circuit patterns for a photomask are designed on a computer with a monitor.

When some patterns having a periodicity are defined in the photomask, an adequate depth of focus can be obtained at the periodic circuit patterns in an exposure process of a photolithography and etching method, so that an optical transfer of the periodic circuit patterns from the photomask to a photoresist layer can be carried out with proper fidelity.

On the other hand, when a circuit pattern is defined as a small and isolated circuit pattern such as a dot-pattern in the photomask, an adequate depth of focus cannot be obtained at the small and isolated circuit pattern in the exposure process, so that an optical transfer of the small and isolated circuit pattern from the photomask to the photoresist layer cannot be carried out with proper fidelity.

In order to improve the fidelity of the circuit patterns in the exposure process, Japanese Laid-Open Patent Publication (KOKAI) No. 2005-062601 discloses that an optical proximity correction (OPC) method is introduced into a design of circuit patterns. Namely, for example, in the OPC method, fine lines forming a circuit pattern are thickened, taking into account margins in relation to other parts of the circuit pattern.

On the other hand, recently, a grid-type design method has been proposed in order to effectively design a large-scale circuit pattern on a computer with a monitor, as will be explained in detail hereinafter.

In particular, in the grid-type design method, a grid is displayed on a monitor screen so that a plurality of minimum unit areas are defined by the grid. For example, each of the minimum unit areas may be defined as a square area having four sides of less than 100 nm.

A design of circuit patterns is carried out on the grid on the monitor screen by using a suitable drawing program installed in the computer. For example, in the design of circuit patterns, when a circuit pattern is defined and drawn as a line segment having some minimum unit areas continuously aligned with each other, the minimum unit areas forming the line segment are displayed on the monitor screen with a suitable single-color which is different from that of the background.

Also, in the design of circuit patterns, a circuit pattern may be defined and drawn as a previously-prepared basic pattern unit which is used to design a primitive section, i.e., a logic circuit section including basic function circuits, inverters, NAND circuits, NOR circuits, an analog core section, an input/output (I/O) section and so on.

After the design of circuit patterns is completed on the computer with the monitor, a photomask is produced based on the design of circuit patterns, and then is used in an exposure process of a photolithography and etching method to optically transfer the circuit patterns from the photomask to a photoresist layer, as stated hereinbefore.

It has now been discovered that the above-mentioned prior art grid-type design method has problems to be solved as mentioned below.

When any one of the circuit patterns is defined as a small and isolated circuit pattern, an adequate depth of focus cannot be obtained at the small and isolated circuit pattern in the exposure process of the photolithography and etching method, so that an optical transfer of the small and isolated circuit pattern from the photomask to the photoresist layer cannot be carried out with proper fidelity, resulting in decline of the manufacturing yield of semiconductor integrated circuit devices.

SUMMARY OF THE INVENTION

In accordance with a first aspect of the present invention, there is provided a semiconductor integrated circuit design method for carrying out a design of circuit patterns. In this method, a plurality of circuit patterns are defined, each of the circuit patterns being composed of at least one minimum unit area, and one is selected from the circuit patterns. Then, an expansion area is defined with respect to the selected circuit pattern so that the selected circuit pattern is at least included in the expansion area, and an area ratio of an area size of the circuit pattern or circuit patterns included in the expansion area to an area size of the expansion area is calculated, and the area ratio is compared with a reference value, which may be set to be at least 0.19.

In the semiconductor integrated circuit design method, when it is determined the area ratio is smaller than the reference value by the comparison of the area ratio with the reference value, the design of circuit patterns may be stopped.

Preferably, when it is determined that the area ratio is smaller than the reference value by the comparison of the area ratio with the reference value, the area size of the circuit pattern or circuit patterns in the expansion area is increased so that the area ratio has at least the reference value. The increase of the area size may be carried out by thickening the selected circuit pattern. Otherwise, the increase of the area size may be carried out by adding at least one dummy circuit pattern to the expansion area.

In the semiconductor integrated circuit design method, the selection of the circuit patterns may be carried out over a logic circuit section.

The circuit patterns include at least one minimum circuit pattern having a minimum standard area which is an integer times larger than an area size of the minimum unit areas. In this case, the minimum circuit pattern is defined as a line segment extended in one direction. Otherwise, the minimum circuit pattern may be defined as a block segment extended in two directions perpendicular to each other.

In the semiconductor integrated circuit design method, preferably, each of the expansion areas may be at least 25 times larger than an area size of the minimum unit areas, and may be at most 400 times larger than the area size of the minimum unit areas. When the area size of the expansion areas is represented by a m×n matrix, each of "m" and "n" falls within an integer range between "5" and "20".

In accordance with a second aspect of the present invention, there is provided a semiconductor integrated circuit device comprising an interconnection layer which is defined by a plurality of circuit patterns including at least a specific circuit pattern which is defined as a minimum circuit pattern in a design stage for the circuit patterns. When a predetermined geometric area is defined with respect to the specific circuit pattern in place so that the specific circuit pattern is included in the geometric area, an area ratio of an area size of the circuit pattern or circuit patterns included in the geometric area to an area size of the geometric area is at least 0.19.

Preferably, each of all the circuit patterns is defined as a combination of minimum unit areas, and each of the minimum unit areas is defined as a square area having four sides of less than 100 nm.

BRIEF DESCRIPTION OF THE DRAWINGS

The present invention will be more clearly understood from the description set forth below, with reference to the accompanying drawings, wherein:

FIG. 4 is a flowchart of a semiconductor integrated circuit design routine which is executed by a computer as a first embodiment of the semiconductor integrated circuit design method according to the present invention;

DESCRIPTION OF THE PREFERRED EMBODIMENTS

Before the description of embodiments of the present invention, for better understanding of the present invention, with reference to FIGS. 1A and 1B, the prior art grid-type design method for designing a circuit patter on a computer with a monitor will now be described below.

Figure 1A:
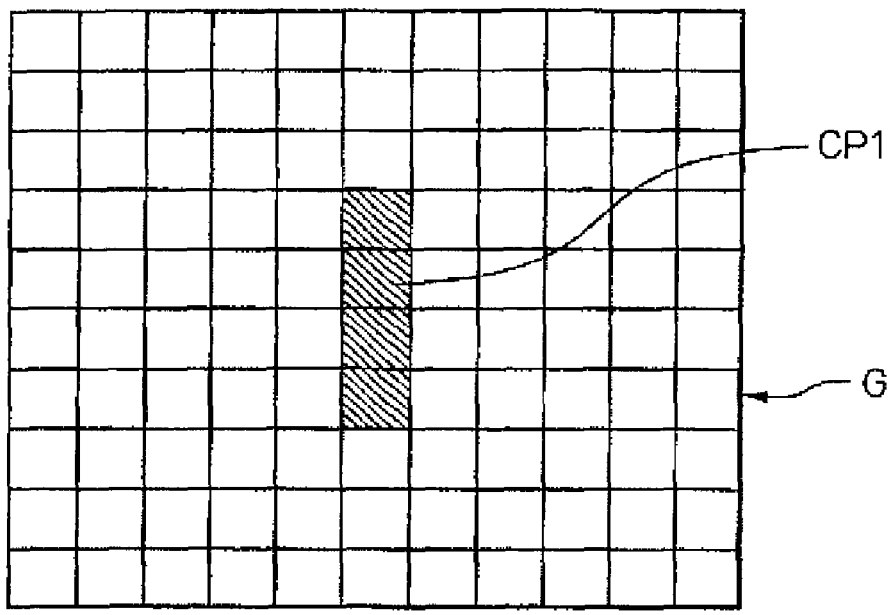
FIG. 1A is a conceptual view showing a part of a monitor screen on which a grid is displayed, to explain a prior art grid-type design method for designing circuit patterns.

First, as shown in FIG. 1A which conceptually illustrates a part of a monitor screen, a grid G is displayed on the monitor screen so that a plurality of minimum unit areas are defined by the grid G. For example, each of the minimum unit areas is defined as a square area having the four sides of 90 nm. Namely, each of the minimum unit areas features an area size of 8,100 nm$^2$.

As shown in FIG. 1A by way of example, a circuit pattern CP1 is defined and drawn in the grid G as a line segment by using a suitable drawing program installed in the computer.

The circuit pattern CP1 is composed of four minimum unit areas continuously aligned with each other, and features the minimum line width of 90 nm. In this drawing, although the circuit pattern CP1 is illustrated as a hatching area, in reality, the four minimum unit areas forming the circuit pattern CP1 are displayed on the monitor screen with a suitable single-color which is different from that of the background.

Figure 1B:
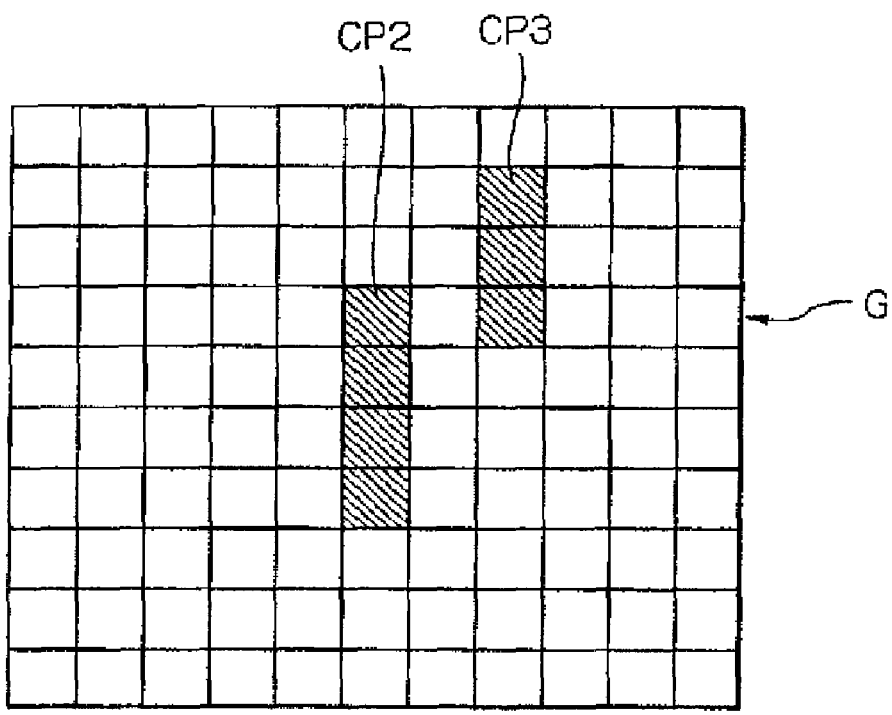
FIG. 1B is a conceptual view similar to FIG. 1A, to further explain the prior art grid-type design method.

Also, in the grid-type design method, as shown in FIG. 1B similar to FIG. 1A, a set of circuit patterns CP2 and CP3 may be defined in the grid G as a basic pattern unit. The circuit pattern CP2 is composed of four minimum unit areas continuously aligned with each other, and the circuit pattern CP3 is composed of 3 minimum unit areas continuously aligned with each other, with each of the circuit patterns CP2 and CP3 featuring the minimum line width of 90 nm.

In reality, various types of basic pattern units are previously prepared and stored in a suitable memory of the computer, and each of the basic pattern units is used to design primitive sections, i.e., logic circuit sections including basic function circuits, such as inverters, NAND circuits, NOR circuits or the like, analog core sections, input/output (I/O) sections and so on.

For example, some of the basic pattern units are displayed on a window defined on the monitor screen, if necessary, and a basic pattern unit is dragged from the window to a given position on the grid G by using the aforesaid drawing program. Of course, the minimum unit areas forming the dragged basic pattern unit are also displayed on the monitor screen with the suitable single-color which is different from that of the background.

After the design of all circuit patterns is completed on the computer with the monitor, a photomask is produced based on the design of the circuit patterns, and then is used in an exposure process of a photolithography and etching method to optically transfer the circuit patterns from the photomask to a photoresist layer, as stated hereinbefore.

As shown in FIGS. 1A and 1B, when each of the circuit patterns CP1, CP2 and CP3 is defined as a small and isolated circuit pattern, an adequate depth of focus cannot be obtained at the small and isolated circuit pattern CP1, CP2 or CP3 in the exposure process of the photolithography and etching method, so that an optical transfer of the small and isolated circuit pattern from the photomask to the photoresist layer cannot be carried out with proper fidelity, resulting in decline of the manufacturing yield of semiconductor integrated circuit devices.

EXPERIMENTS

The inventor conducted an experiment which leads to the present invention.

In the experiment, a design of circuit patterns was carried out on a computer with a monitor based on a certain specification.

Figure 2A:
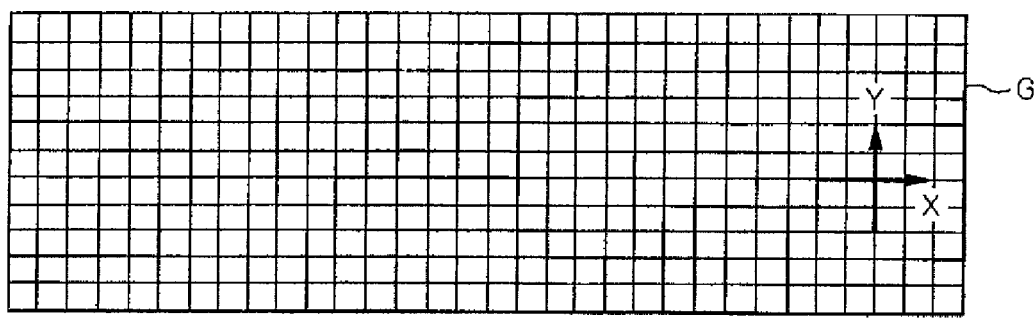
FIG. 2A is a conceptual view showing a part of a monitor screen on which a grid is displayed, to explain an experiment conducted by the inventor.

In particular, first, as shown in FIG. 2A which conceptually illustrates a part of a monitor screen, a grid G was displayed on the monitor screen so that a plurality of minimum unit areas were defined by the grid G. Similar to the aforesaid prior art grid-type design method (see: FIGS. 1A and 1B), each of the minimum unit areas was defined as a square area having four sides of 90 nm. Namely, each of the minimum unit areas had the area size of 8,100 nm$^2$. Note, an X-Y coordinate system was defined on the grip G for the sake of convenience of explanation.

Then, the design of circuit patterns was carried out on the grid G in substantially the same prior art grid-type design manner as explained with reference to FIGS. 1A and 1B. In this design, a minimum circuit pattern was defined as having 3 minimum unit areas, i.e., an area size of 24,300 (=3×8,100) nm$^2$.

After the design of circuit patterns was completed, the minimum circuit patterns having the area size of 24,300 nm$^2$ were extracted from all the circuit patterns.

Figure 2B:
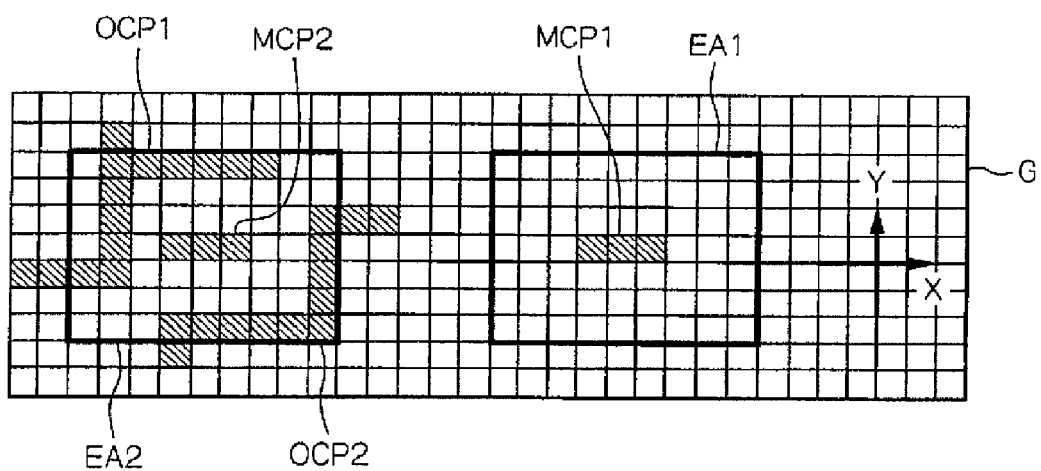
FIG. 2B is a conceptual view similar to FIG. 2A, to further explain the experiment conducted by the inventor.

Referring to FIG. 2B similar to FIG. 2A, only two of the extracted minimum circuit patterns, indicated by references MCP1 and MCP2, are represented by way of example. In this example, the minimum circuit pattern MCP1 was defined as a small and isolated circuit pattern. On the other hand, there were other circuit patterns OCP1 and OCP2 beside the minimum circuit pattern MCP2. The circuit patterns OCP1 and OCP2 were composed of 14 minimum unit areas and 13 minimum unit areas, respectively. Namely, the circuit pattern OCP1 had the area size of 113,300 (=14×90×90) nm$^2$, and the circuit pattern OCP2 had the area size of 105,300 (~13×90×90) nm$^2$.

Then, an area EA1 including the minimum circuit pattern MCP1 was defined as an expansion area which was obtained by expanding the minimum circuit pattern MCP1 by 3 minimum unit areas in both the plus and minus directions of the X axis of the X-Y coordinate system and by 3 minimum unit areas in both the plus and minus directions of the Y axis of the X-Y coordinate system. Namely, the expansion area EA1 had the area size of 510,300 (=9×7×90×90) nm$^2$, and corresponded to the 63 minimum unit areas.

Similarly, an area EA2 including the minimum circuit pattern MCP2 was defined as an expansion area which was obtained by expanding the minimum circuit pattern MCP2 by 3 minimum unit areas in both the plus and minus directions of the X axis of the X-Y coordinate system and by 3 minimum unit areas in both the plus and minus directions of the Y axis of the X-Y coordinate system. Namely, the expansion area EA2 also had the area size of 510,300 (~9×7×90×90) nm$^2$, and corresponded to the 63 minimum unit areas.

As shown in FIG. 2B, only the minimum circuit pattern MCP1 having the area size of 24,300 (=3×8,100) nm$^2$ was included in the expansion area EA1 as the small and isolated circuit pattern. The number "N" of the minimum unit areas, forming the circuit pattern MCP1 in the expansion area EA2, was 3. In this case, an area ratio of the area size (N=3) of the circuit pattern MCP1 to the area size (63) of the expansion area EA1 was about 4.76% (i.e., (3/63)×100%).

On the other hand, as shown in FIG. 2B, parts of the circuit patterns OCP1 and OCP2 were included in the expansion area EA2. Namely, both the part of the circuit pattern OCP1 corresponding to the 11 minimum unit areas and the part of the circuit pattern OCP2 corresponding to the 10 minimum unit areas were included in the expansion area EA2. Thus, the number "N" of the minimum unit areas, forming the circuit pattern MCP2 and the parts of the circuit patterns OCP1 and OCP2 in the expansion area EA2, was 24 (=3+11+10). In this case, an area ratio of the area size (N=24) of the circuit pattern MCP2 and the parts of the circuit patterns OCP1 and OCP2 to the area size (63) of the expansion area EA2 was about 38.1% (i.e., (24/63)×100%).

In this experiment, after all the expansion areas (EA1, EA2) were defined, the number "N" of the minimum unit areas, forming the circuit pattern or circuit patterns in each of the expansion areas (EA1, EA2), was counted.

Figure 3A:
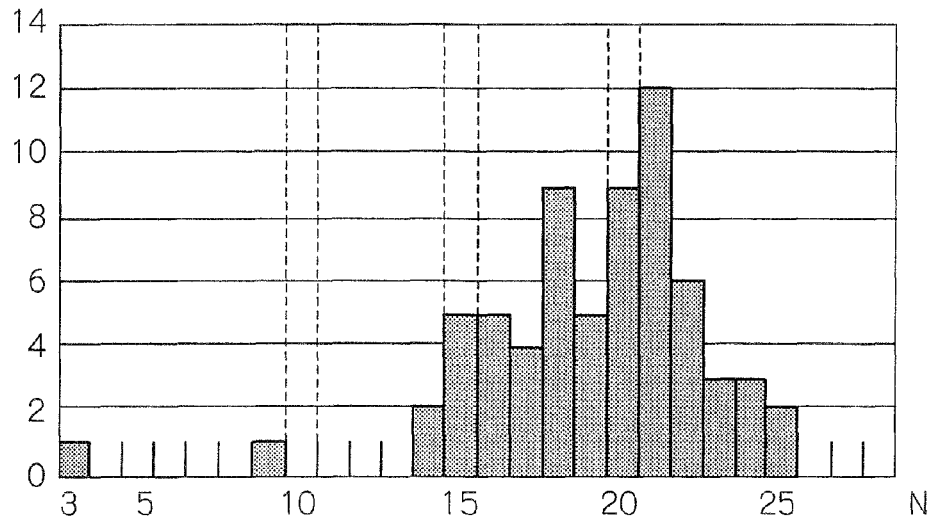
FIG. 3A is a histogram to further explain the experiments conducted by the inventor.

FIG. 3A is a histogram showing the numbers "N" in all the expansion areas (EA1, EA2) and the frequencies of the numbers "N".

As shown in the histogram of FIG. 3A, for example, there was only one expansion area (EA1) which includes 3 minimum unit areas (N=3) forming the minimum circuit pattern (MCP1). Also, there were two expansion areas, each of which was 14 minimum unit areas (N=14) forming the circuit patterns. Further, there were nine expansion areas, each of which was 20 minimum unit areas (N=20) forming the circuit patterns.

Next, a photomask was produced based on the aforesaid design of circuit patterns, and a first exposure process and a second exposure process were actually carried out by using the produced photomask. The first and second exposure processes used a reduction-projection type exposure apparatus which had an ArF excimer laser source featuring a wavelength of 193 nm.

In the first exposure process, the circuit patterns were optically projected and transferred from the photomask to a first photoresist layer under optical conditions that the numerical aperture (NA) was 0.75, and the sigma value "σ" was 0.7. Also, In the first exposure process, the best focus was completely set. Namely, the first exposure process was carried out in the best focus mode.

In the second exposure process, the circuit patterns were optically projected and transferred from the photomask to a second photoresist layer under substantially the same optical conditions as in the first exposure process. However, the focus was offset by 0.2 μm in comparison with the best focus. Namely, the second exposure process was carried out in the focus-offset mode.

Note that a positive type chemical resist material was used for the first and second photoresist layer.

Next, the first and second photoresist layers were developed by using a usual developing process to thereby produce a first photoresist pattern layer carrying the transferred circuit patterns and a second photoresist pattern layer carrying the transferred circuit patterns. Subsequently, in the first photoresist pattern layer, a line width of the circuit pattern or circuit patterns was measured in each of all the expansion areas (EA1, EA2). Similarly, in the second photoresist pattern layer, a line width of the circuit pattern or circuit patterns was measured in each of all the expansion areas (EA1, EA2).

Figure 3B:
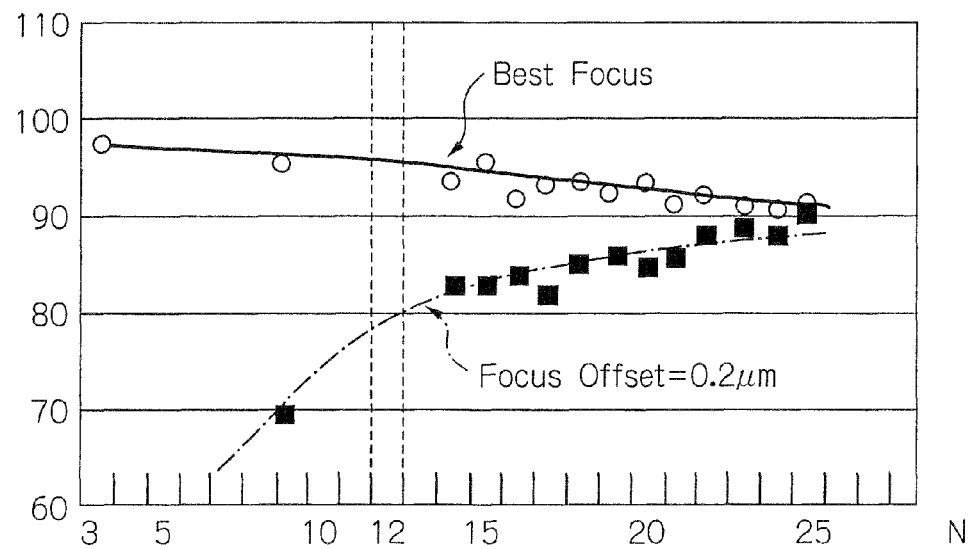
FIG. 3B is a graph to further explain the experiment conducted by the inventor.

The measurement results on the first and second photoresist pattern layers are shown in a graph of FIG. 3B. In this graph, the abscissa represents the number "N" in each of the expansion areas (EA1, EA2), and the ordinate represents the line width in each of the expansion areas (EA1, EA2).

In the graph of FIG. 3B, the measurement results on the first photoresist pattern layer are represented by open circles "○", and the measurement results on the second photoresist pattern layer are represented by solid squares "●".

As shown in the graph of FIG. 3B, in the second photoresist pattern layer, when the number "N" of the minimum unit areas was less than 12, i.e., when the area ratio of the area size (N=12) of the circuit patterns to the area size (N=63) of the expansion area was less than 19.0% (i.e., (12/63)×100%), the line width of the circuit patterns was less than 80 nm.

Thus, as is apparent from the graph of FIG. 3B, when an exposure process is carried out with the offset focus (0.2 μm), an area ratio of an area size (N=12) of circuit patterns to an area size (N=63) of an expansion area must be at least 19% before the circuit patterns can be optically projected and transferred from a photomask to a photoresist layer with proper fidelity.

First Embodiment

FIG. 4 is a flowchart of a semiconductor integrated circuit design routine which is executed as a first embodiment of the semiconductor integrated circuit design method according to the present invention.

The semiconductor integrated circuit design routine of FIG. 4 is executed provided that all circuit patterns are already carried out on a computer with a monitor by using a suitable drawing program in substantially the same prior art grid-type design manner as explained with reference to FIGS. 1A and 1B, and the designed circuit patterns are stored in a random access memory (RAM) of the computer.

At step 401, one of the circuit patterns is selected and read from the RAM. Then, at step 402, it is determined whether the selected circuit pattern is a minimum circuit pattern which is composed of 3 minimum unit areas continuously aligned with each other.

For example, each of the minimum unit areas is defined as a square area having four sides of 90 nm. Namely, each of the minimum unit areas has an area size of 8,100 $nm^2$. Thus, the minimum circuit pattern has the area size of a area size of 24,300 (−3×8,100) $nm^2$.

At step 403, an expansion area, as indicated by reference EA1 or EA2 in FIG. 2B, is defined with respect to the minimum circuit pattern concerned.

As explained with reference to FIG. 2B, the definition of the expansion area (EA1, EA2) is carried out by expanding the minimum circuit pattern (MCP1, MCP2) by 3 minimum unit areas in both the plus and minus directions of the X axis of the X-Y coordinate system and by 3 minimum unit areas in both the plus and minus directions of the Y axis of the X-Y coordinate system. Namely, the expansion area (EA1, EA2) has the area size of 510,300 (−9×7×90×90) $nm^2$, and corresponds to the 63 minimum unit areas.

At step 404, the number "N" of minimum unit areas, forming the circuit pattern or circuit patterns in the expansion area concerned, is counted. Namely, an area size of the circuit pattern or circuit patterns in the expansion area concerned is measured. Then, at step 405, it is determined whether the number "N" is equal to or more than a reference value "12", from which the aforesaid area ratio of 19% is derived (see: the graph of FIG. 3B). If N≧12, the control proceeds to step 406, in which it is determined there are non-selected circuit patterns. If there are the non-selected circuit patterns, the control returns to step 401.

Thereafter, as long as it is determined whether the number "N" is equal to or more than the reference value "12" at step 405, the routine formed by steps 401 to 406 is repeatedly executed until it is confirmed at step 406 that all the circuit patterns have been selected.

When it is determined that all the circuit patterns have been selected at step 406, the control proceeds from step 406 to step 407, in which "OK" is displayed on the monitor screen to thereby announce to an operator that the design of circuit patterns has been properly carried out. Then, the semiconductor integrated circuit design routine of FIG. 4 ends.

On the other hand, at step 405, if it is determined that the number "N" is smaller than the reference value "12", the control proceeds from step 405 to step 408, in which an error is displayed on the monitor screen to thereby announce to the operator that the design of circuit patterns has not been properly carried out. Then, the semiconductor integrated circuit design routine of FIG. 4 ends.

Note, in the semiconductor integrated circuit design routine of FIG. 4, the selection of the circuit patterns may carried out only over a primitive section, i.e., a logic circuit section on the monitor screen, because a minimum circuit pattern can be frequently left as an isolated pattern in the logic circuit section.

Second Embodiment

With reference to FIGS. 5, 6 and 7A and 7B, a second embodiment of the semiconductor integrated circuit design method according to the present invention will now be explained below.

Figure 5:
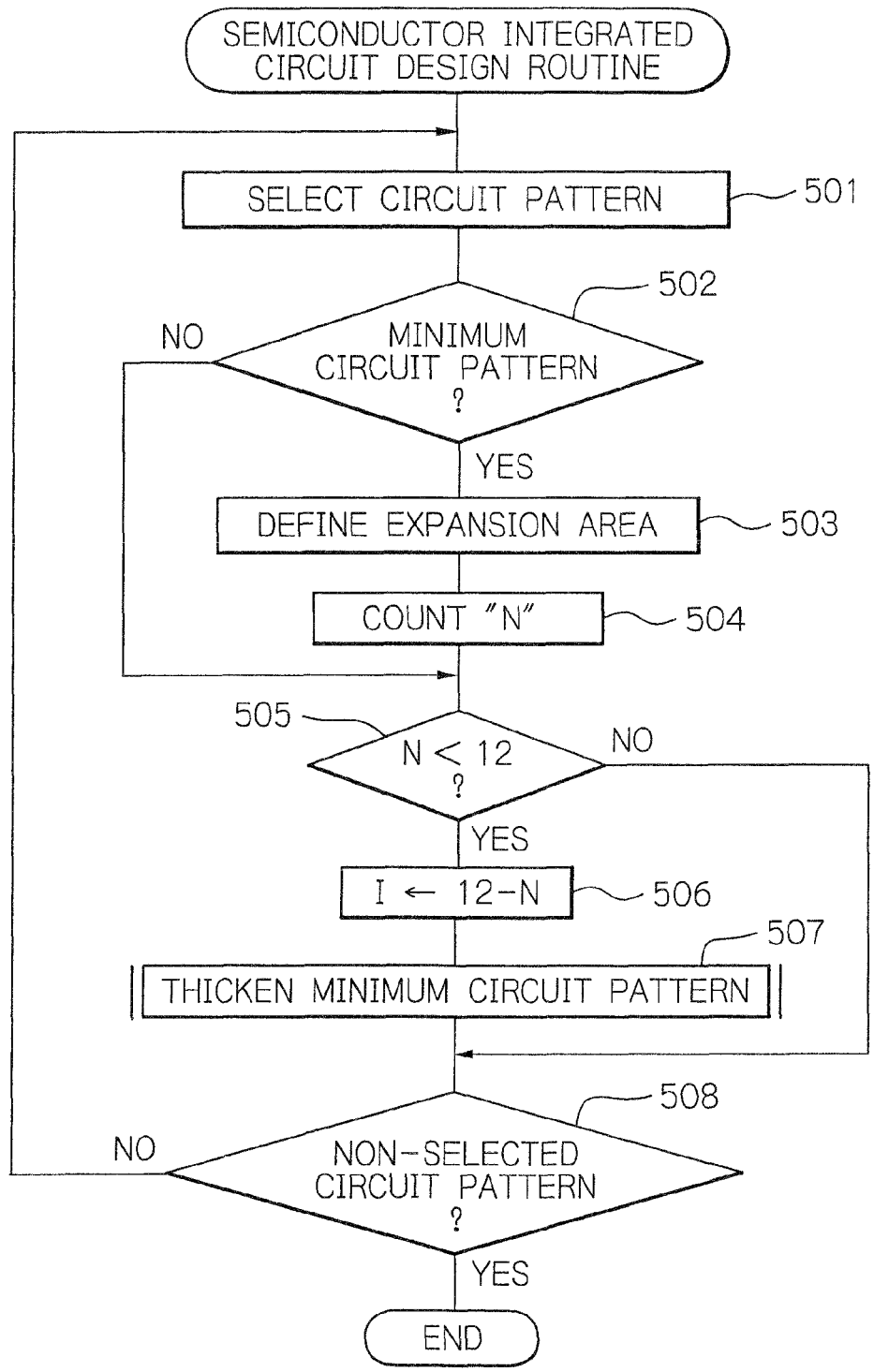
FIG. 5 is a flowchart of a semiconductor integrated circuit design routine which is executed by a computer as a second embodiment of the semiconductor integrated circuit design method according to the present invention.
Figure 6:
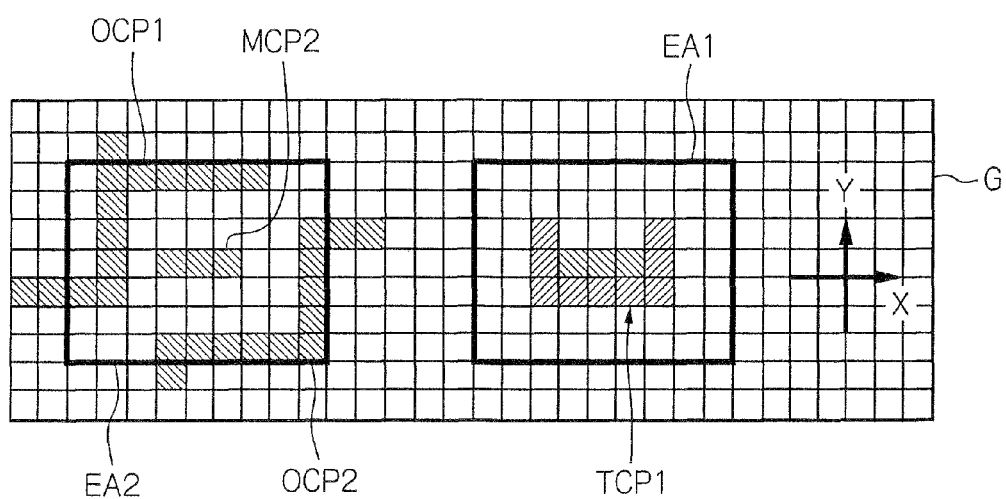
FIG. 6 is a conceptual view similar to FIG. 2B, to assist in an explanation of the semiconductor integrated circuit design routine of FIG. 5.
Figure 7A:
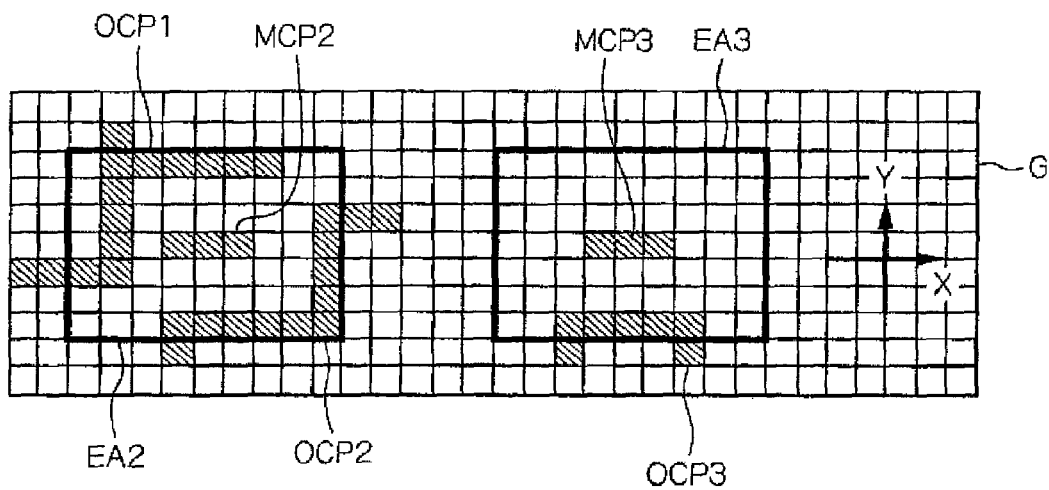
FIGS. 7A and 7B are other conceptual views similar to FIG. 2B, to assist the explanation of the semiconductor integrated circuit design routine of FIG. 5.
Figure 7B:
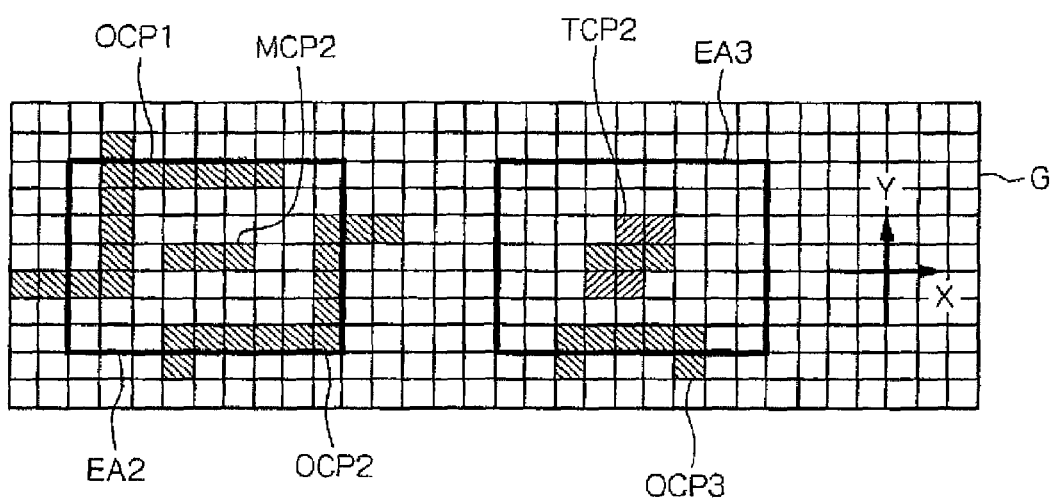

Note, FIG. 5 is a flowchart of a semiconductor integrated circuit design routine which is executed as the second embodiment of the present invention by a computer with a monitor, and FIGS. 6, 7A and 7B are conceptual views similar to FIG. 2B, to assist in the explanation of the semiconductor integrated circuit design routine of FIG. 5.

Since steps 501 through 504 of the semiconductor integrated circuit design routine of FIG. 5 are substantially identical to respective steps 401 through 404 of the semiconductor integrated circuit design routine of FIG. 4, the explanation of steps 501 through 504 is omitted.

At step 505, it is determined whether the number "N" is smaller than the reference value "12" which is determined based on the graph of FIG. 3B. If N<12, the control proceeds to step 506, in which the following calculation is executed:

I←12−N

At step 507, the minimum circuit pattern concerned is thickened by adding "I" minimum unit areas to the minimum circuit pattern. For example, if the minimum circuit pattern concerned is what is indicated by reference MCP1 in FIG. 2B, and if "I"=9, as shown in FIG. 6 similar to FIG. 2A, 9 minimum unit areas are added to the minimum circuit pattern MCP1 to thereby produce a thickened circuit pattern TCP1. In this case, an area ratio of the area size of the thicken circuit pattern TCP2 to the area size of the expansion area EA1 is 19%.

On the other hand, as shown in FIG. 7A similar to FIG. 2B, when the expansion area concerned is what is indicated by reference EA3, and when the expansion area EA3 includes a minimum circuit pattern MCP3 and a part of another circuit pattern OCP3 corresponding to 5 minimum unit areas, "I" is 4 (12−(3+5)). In this case, for example, as shown FIG. 7B, 4 minimum unit areas are added to the minimum circuit pattern MCP3 to thereby produce a thickened circuit pattern TCP2, and an area ratio of the area size of the thicken circuit pattern TCP2 and the part of the circuit pattern OCP3 to the area size of the expansion area EA1 also is 19%.

After the thickening of the minimum circuit pattern (MCP1, MCP3) is completed, the control proceeds to step 508 in which it is determined whether there are non-selected circuit patterns. If there are the non-selected circuit patterns, the control returns to step 501.

On the other hand, at step 405, if N≧12, i.e., if the expansion area concerned is what is indicated by reference EA2 (see: FIG. 6), the control skips to step 508.

In either event, the control returns from step 506 to step 501 until it is confirmed at step 506 that all the circuit patterns have been selected. Then, when it is confirmed at step 506 that all the circuit patterns have been selected, the semiconductor integrated circuit design routine of FIG. 5 ends.

After the design of circuit patterns is completed, a photomask is produced based on the design of circuit patterns. Then, in an exposure process, the circuit patterns are optically projected and transferred from the photomask to a photoresist layer. In this case, even if the exposure process is carried out in the focus-offset mode, it is possible to carry out the optical transfer of the circuit patterns to the photoresist layer with proper fidelity, because all the aforesaid area ratios are set to be at least 19%.

Third Embodiment

Figure 8:
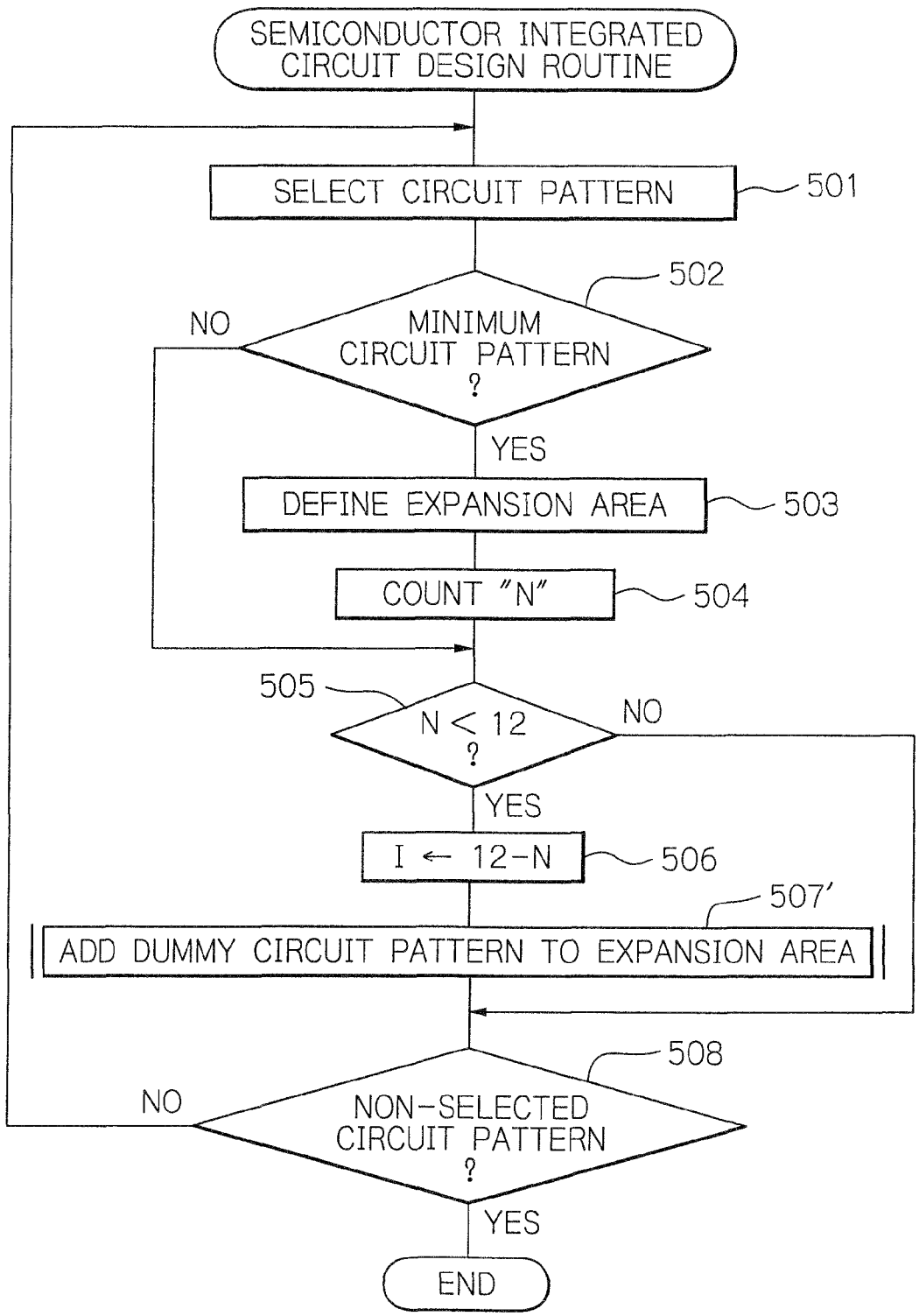
FIG. 8 is a flowchart of a semiconductor integrated circuit design routine which is executed by a computer as a third embodiment of the semiconductor integrated circuit design method according to the present invention.
Figure 9:
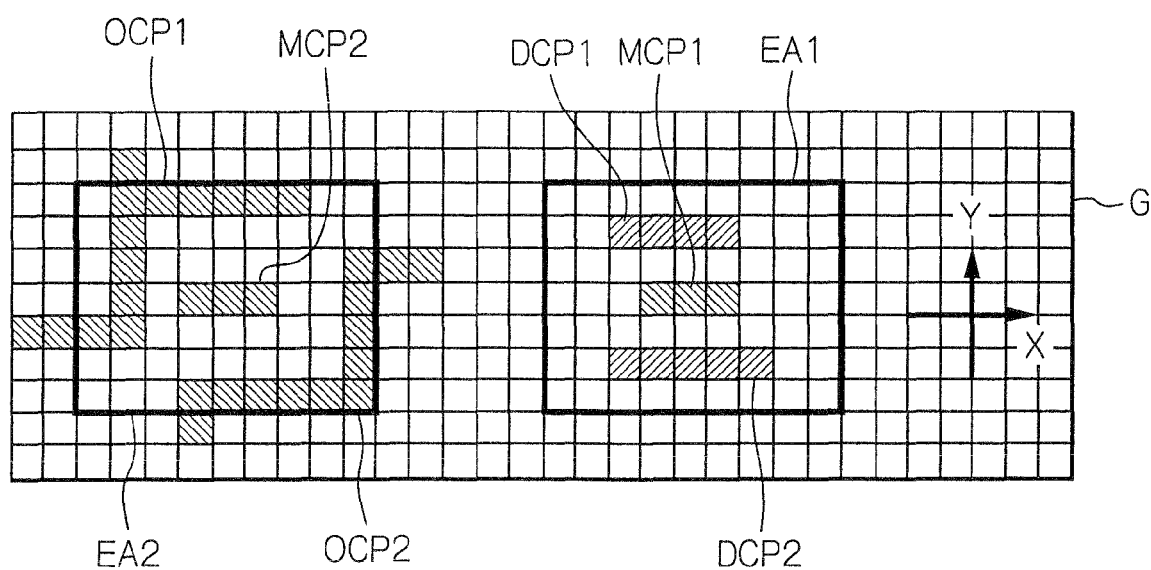
FIG. 9 is a conceptual view similar to FIG. 2B, to assist in an explanation of the semiconductor integrated circuit design routine of FIG. 8.

With reference to FIGS. 8 and 9, a third embodiment of the semiconductor integrated circuit design method according to the present invention will now be explained below.

Note, FIG. 8 is a flowchart of a semiconductor integrated circuit design routine which is executed as the third embodiment of the present invention by a computer with a monitor, and FIG. 9 is a conceptual view similar to FIG. 2B, to assist in the explanation of the semiconductor integrated circuit design routine of FIG. 8.

Since the semiconductor integrated circuit design routine of FIG. 8 is substantially identical to the semiconductor integrated circuit design routine of FIG. 5 except that step 507' of FIG. 8 is substituted for step 507 of FIG. 5, the explanation is given of only steps 505, 506 and 507' of FIG. 8.

At step 505, If N<12, the control proceeds to step 506, in which the following calculation is executed:

I←12−N

At step 507', for example, at least one dummy circuit pattern is added to the expansion area concerned. For example, if the expansion area concerned is what is indicated by reference EA1 in FIG. 2B, and if "I"=9, as shown in FIG. 9 similar to FIG. 2A, two dummy circuit patterns DCP1 and DCP2 are added to the expansion area EA1 beside the minimum circuit pattern MCP1. The dummy circuit patterns OCP1 and OCP2 are composed of 4 minimum unit areas and 5 minimum unit areas, respectively. Accordingly, an area ratio of the area size (N=12) of the minimum circuit pattern MCP1 and the dummy circuit patterns DCP1 and DCP2 to the area size of the expansion area EA1 is 19%.

After the design of circuit patterns is completed, a photomask is produced based on the design of circuit patterns. Then, in an exposure process, the circuit patterns are optically projected and transferred from the photomask to a photoresist layer. Similar to the first embodiment, even if the exposure process is carried out in a widened focus margin mode, it is possible to carry out the optical transfer of the circuit patterns to the photoresist layer with proper fidelity, because all the aforesaid area ratios are set to be at least 19%.

Modifications

Figure 10A:
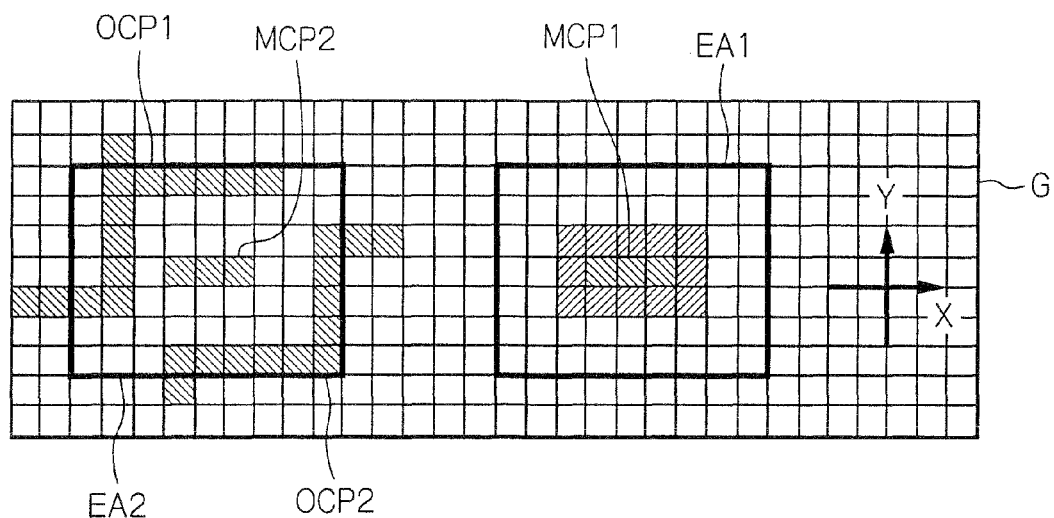
FIG. 10A is a conceptual view similar to FIG. 6, to explain a modification of the second embodiment of FIG. 5.

In the above-mentioned second embodiment, as shown in FIG. 10A similar to FIG. 6, the minimum circuit pattern MCP1 may be thickened by adding 12 minimum unit areas to a periphery of the minimum circuit pattern MCP1. Namely, the minimum circuit pattern MCP1 is completely surrounded by the 12 minimum unit areas to thereby produce a thickened circuit pattern, so that the area ratio of the thickened circuit pattern to the area size of the expansion area EA1 is set to be about 23.9% (i.e., (15/63)×100%). Of course, in this case, at step 505 of FIG. 5, the number "N" of minimum unit areas is compared with a reference value "18".

Figure 10B:
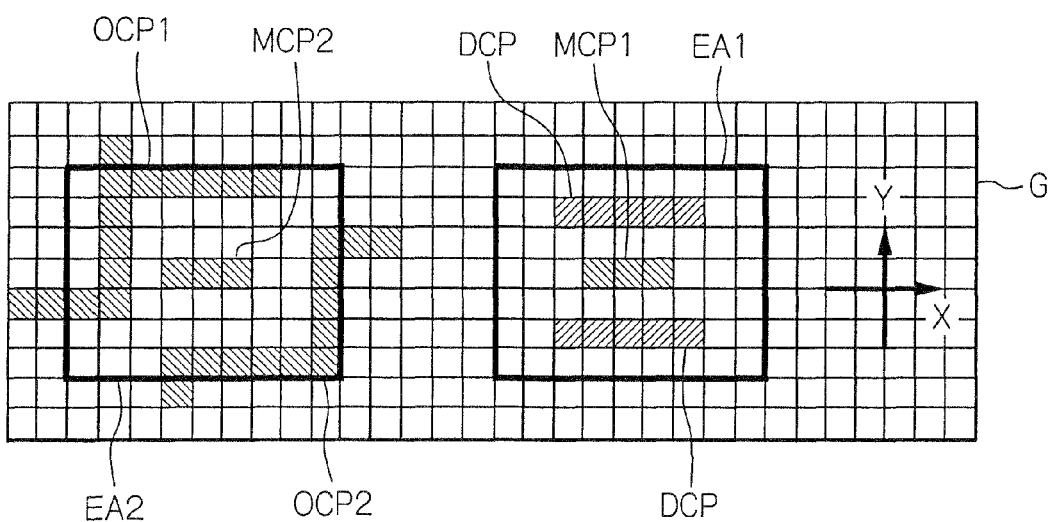
FIG. 10B is a conceptual view similar to FIG. 8, to explain a modification of the third embodiment of FIG. 8.

Also, in the above-mentioned third embodiment, as shown in FIG. 10B similar to FIG. 9, two dummy circuit patterns DCP, which are identical to each other, may be added to the expansion area EA1. In this case, each of the dummy circuit patterns DCP is composed of 5 minimum unit areas, the area ratio of the minimum circuit pattern MCP1 and both the dummy circuit patterns DCP to the area size of the expansion area EA1 is set to be about 20.6% (i.e., (13/63)×100%). Of course, in this case, at step 508 of FIG. 8, the number "N" of minimum unit areas is compared with a reference value "13".

In the above-mentioned first, second and third embodiments, each of the minimum circuit pattern may be defined as a circuit pattern having at most 4 minimum unit areas. Namely, the small circuit pattern having the 4 minimum unit areas is processed in a similar manner to the minimum circuit pattern having the 3 minimum unit areas.

Figure 11:
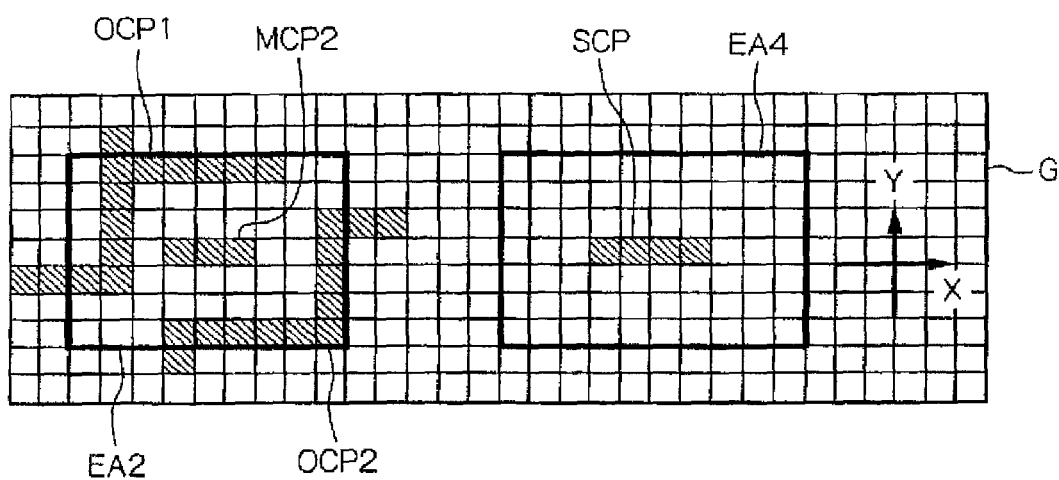
FIG. 11 is a conceptual view similar to FIG. 2B, showing a small circuit pattern which may be processed together with minimum circuit patterns in the first, second and third embodiments of FIGS. 4, 5 and 7.

In particular, as shown in FIG. 11 similar to FIG. 2B, when the small circuit pattern SCP having the 4 minimum unit areas is selected, an expansion area EA4 is defined by expanding the small circuit pattern SCP by 3 minimum unit areas in both the plus and minus directions of the X axis of the X-Y coordinate system and by 3 minimum unit areas in both the plus and minus directions of the Y axis of the X-Y coordinate system. Thus, the expansion area EA4 has the area size of 567,000 (10×7×90×90) nm$^2$, and corresponds to the 70 minimum unit areas. When the semiconductor design routine of FIG. 5 or 8 is executed, the expansion area EA4 is processed in a similar manner to the expansion areas EA1, EA2 and EA3.

Also, in the above-mentioned first, second and third embodiments, each of the minimum circuit patterns (MCP1, MCP2, MCP3) is defined as having the line segment extended in one direction and composed of 3 minimum unit areas.

Figure 12A:
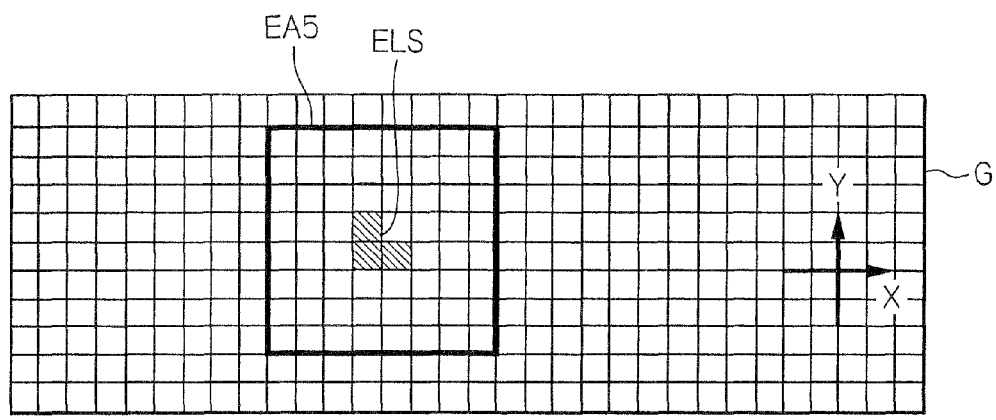
FIG. 12A is a conceptual view similar to FIG. 2B, to explain a modification of the minimum circuit pattern processed in the first, second and third embodiments of FIGS. 4, 5 and 7.

However, as shown in FIG. 12A, each of the minimum circuit patterns may be defined as an elbow-like block segment ELS extended in the X and Y directions perpendicular to each other and composed of 3 minimum unit areas. In this case, an expansion area EA5 is defined by expanding the elbow-like block segment ELS by 3 minimum unit areas in both the plus and minus directions of the X axis of the X-Y coordinate system and by 3 minimum unit areas in both the plus and minus directions of the Y axis of the X-Y coordinate system. Thus, the expansion area EA5 has the area size of 518,400 (8×8×90×90) nm$^2$, and corresponds to the 64 minimum unit areas. When the grid-type design routine of FIG. 5 or 8 is executed, the expansion area EA5 is processed in a similar manner to the expansion areas EA1, EA2 and EA3.

Figure 12B:
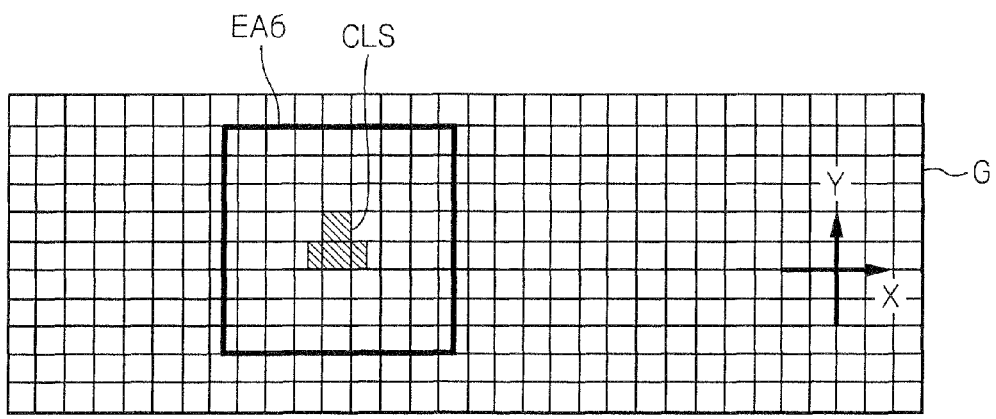
FIG. 12B is a conceptual view similar to FIG. 2B, to explain another modification of the minimum circuit pattern processed in the first, second and third embodiments of FIGS. 4, 5 and 7.

On the other hand, as shown in FIG. 12B, each of the minimum circuit patterns may be defined as a convex-like block segment CLS extended in the X and Y directions perpendicular to each other and composed of 3 minimum unit areas, and may be offset by a half pitch of the array of the minimum unit areas. In this case, an expansion area EA6 is defined by expanding the convex-like block segment CLS by 3 minimum unit areas in both the plus and minus directions of the X axis of the X-Y coordinate system and by 3 minimum unit areas in both the plus and minus directions of the Y axis of the X-Y coordinate system. Thus, the expansion area EA6 also has the area size of 518,400 (8×8×900×90) nm$^2$, and corresponds to the 64 minimum unit areas. When the semiconductor integrated circuit design routine of FIG. 5 or 8 is executed, the expansion area EA6 is also processed in a similar manner to the expansion areas EA1, EA2 and EA3.

In the above-mentioned embodiments, the area size of the expansion area (EA1, EA2, EA3, EA4, EA5, EA6) is variable in accordance with both a size and a shape of the minimum circuit pattern (MCP1, MCP2, MCP3, ELS, CLS). However, the area size of the expansion areas should be at least 25 times larger than the area size of the minimum unit area, and should be at most 400 times larger than the area size of the minimum unit area. Namely, when the area size of the expansion area is represented by an m×n matrix, each of "m" and "n" falls within the integer range between "5" and "20".

Semiconductor Integrated Circuit Device

Figure 13A:
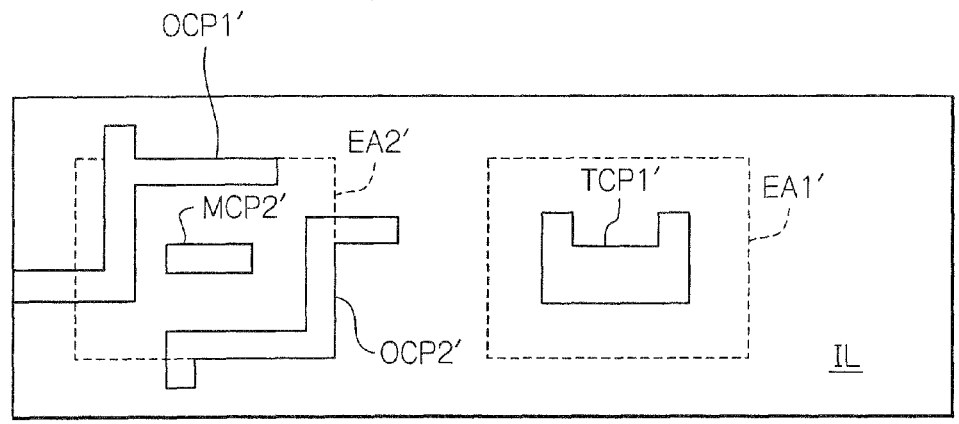
FIG. 13A is a partial plan view of a semiconductor integrated circuit device manufactured in accordance with the second embodiment of the semiconductor integrated circuit design method according to the present invention of FIG. 5.

With reference to FIG. 13A which is a partial plan view of a semiconductor integrated circuit device which is manufactured in accordance with the first embodiment of the grid-type design method of FIG. 5, circuit patterns TCP1', MCP2', OCP1' and OCP2' are formed in an insulating layer IL on a semiconductor integrated circuit device by using a damascene process, and the photomask, which is produced based on the design of circuit patterns obtained by the grid-type design method of FIG. 5, is used in the damascene process. The respective circuit patterns TCP1', MCP2', OCP1' and OCP2' correspond to the circuit patterns TCP1, MCP2, OCP1 and OCP2 of FIG. 6, and the respective circuit patterns TCP1' and MCP2' are defined as specific circuit patterns which are derived from the minimum circuit pattern MCP1 and MCP2.

Accordingly, when a geometrical area EA1' which corresponds to the expansion area EA1 (see: FIG. 6), is applied to the specific circuit pattern TCP1' in place, the specific circuit pattern TCP1' is completely included in the geometrical area EA1'. Thus, the semiconductor integrated circuit device of FIG. 13A features that the area ratio of the area size of the specific circuit pattern TCP1' to the area size of the geometrical area EA1' is 19%.

On the other hand, when a geometrical area EA2' corresponding to the expansion area EA2 (see: FIG. 6) is applied to the specific circuit pattern MCP2', not only the specific circuit pattern MCP2' but also both a part of the circuit pattern OCP1' and a part of the circuit pattern OCP2' are included in the geometrical area EA2'. Thus, the semiconductor integrated circuit features that the area ratio of the area size of the specific circuit pattern MCP1' and both the parts of the circuit patterns OCP1' and OCP2' to the area size of the geometrical area EA2' is 38.1%.

Figure 13B:
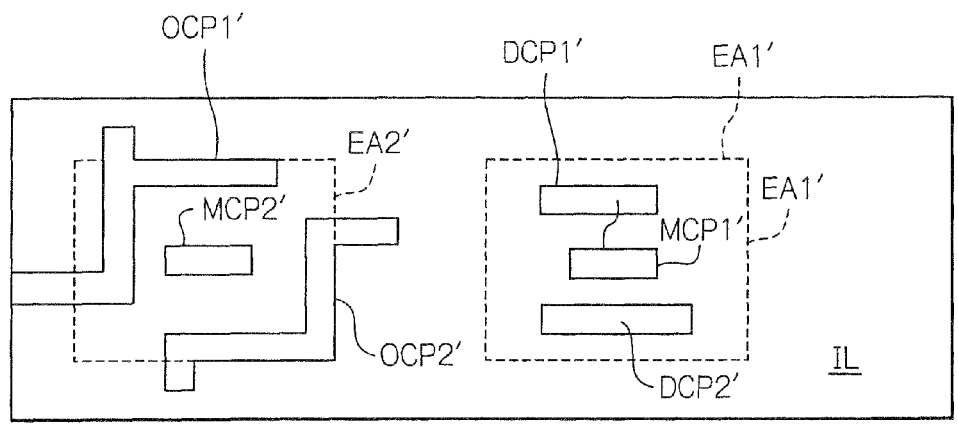
FIG. 13B is a partial plan view of a semiconductor integrated circuit device manufactured in accordance with the third embodiment of the semiconductor integrated circuit design method according to the present invention of FIG. 8.

With reference to FIG. 13B which is a partial plan view of a semiconductor integrated circuit device which is manufactured in accordance with the second embodiment of the grid-type design method of FIG. 8, circuit patterns MCP1', DCP1', DCP2', MCP2', OCP1' and OCP2' are formed in an insulating layer IL on a semiconductor integrated circuit device by using a damascene process, and the photomask, which is produced based on the design of circuit patterns obtained by the grid-type design method of FIG. 8, is used in the damascene process. The respective circuit patterns MCP1', DCP1', DCP2', MCP2', OCP1' and OCP2' correspond to the circuit patterns MCP1, DCP1, DCP2, MCP2, OCP1 and OCP2 of FIG. 9, and the respective circuit patterns MCP1' and MCP2' are defined as specific circuit patterns which are derived from the minimum circuit patterns MCP1 and MCP2.

Accordingly, when a geometrical area EA1', which corresponds to the expansion area EA1 (see: FIG. 9), is applied to the specific circuit pattern MCP1' in place, the specific circuit pattern MCP1' and the circuit patterns DCP1' and DCP2' are completely included in the geometrical area EA1'. Thus, the semiconductor integrated circuit device of FIG. 13A features that the area ratio of the area size of the specific circuit pattern TCP1' to the area size of the geometrical area EA1' is 19%.

On the other hand, the explanation given for the specific circuit pattern MC2' of FIG. 13A is true for the specific circuit pattern MC2' of FIG. 13B.

Finally, it will be understood by those skilled in the art that the foregoing description is of preferred embodiments of the method and the device, and that various changes and modifications may be made to the present invention without departing from the spirit and scope thereof.

What is claimed is:

1. A semiconductor integrated circuit design method for carrying out a design of circuit patterns incorporated with a program installed on a computer comprised of a monitor screen and a random access memory, the program executable to cause the computer to perform the following steps:

defining a plurality of circuit patterns, each of which is composed of at least one minimum unit area;
selecting one circuit pattern from said circuit patterns;
defining an expansion area with respect to the selected circuit pattern so that said expansion area includes at least the selected circuit pattern;
calculating an area ratio of an area size of the selected circuit pattern or the selected circuit pattern and one or more other circuit patterns included in said expansion area to an area size of said expansion area; and
comparing said area ratio with a reference value to determine performing a next step.

2. The semiconductor integrated circuit design method as set forth in claim 1, further comprising:
upon a determination obtained in said comparing step that said area ratio is smaller than said reference value, stopping the design of circuit patterns.

3. The semiconductor integrated circuit design method as set forth in claim 1, further comprising:
upon a determination obtained in said comparing step that said area ratio is smaller than said reference value, increasing said area size of the selected circuit pattern or the selected circuit pattern and one or more other circuit patterns included in said expansion area so that said area ratio has at least said reference value.

4. The semiconductor integrated circuit design method as set forth in claim 3, wherein the increasing of said area size in said increasing step is carried out by thickening the selected circuit pattern.

5. The semiconductor integrated circuit design method as set forth in claim 3, wherein the increasing of said area size in said increasing step is carried out by adding at least one dummy circuit pattern to said expansion area.

6. The semiconductor integrated circuit design method as set forth in claim 1, wherein said selecting step is carried out over a logic circuit section.

7. The semiconductor integrated circuit design method as set forth in claim 1, wherein said reference value is set to be at least 0.19.

8. The semiconductor integrated circuit design method as set forth in claim 1, wherein said circuit patterns include at least one minimum circuit pattern having a minimum standard area which is an integer times larger than an area size of said minimum unit areas.

9. The semiconductor integrated circuit design method as set forth in claim 8, wherein said minimum circuit pattern is defined as a line segment extended in one direction.

10. The semiconductor integrated circuit design method as set forth in claim 8, wherein said minimum circuit pattern is defined as a block segment extended in two directions perpendicular to each other.

11. The semiconductor integrated circuit design method as set forth in claim 1,
wherein said expansion area is at least 25 times larger than an area size of said minimum unit area, and
wherein said expansion area is at most 400 times larger than the area size of said minimum unit area.

12. The semiconductor integrated circuit design method as set forth in claim 1,
wherein the area size of said expansion area is represented by a m×n matrix, and wherein m and n are both within an integer range between 5 and 20.

13. A semiconductor integrated circuit device, comprising:
an interconnection layer,
wherein said interconnection layer is defined by a plurality of circuit patterns including at least a specific circuit pattern defined as a minimum circuit pattern in a design stage for the circuit patterns, and
wherein, when a predetermined geometric area is defined with respect to said specific circuit pattern in place so that said specific circuit pattern is included in said geometric area, an area ratio of an area size of the specific circuit pattern or specific circuit pattern and other circuit patterns included in said geometric area to an area size of said geometric area is at least 0.19.

14. The semiconductor integrated circuit device as set forth in claim 13, wherein each of the circuit patterns is defined as a combination of minimum unit areas, each of the minimum unit areas being defined as a square area having four sides of less than 100 nm.

15. The semiconductor integrated circuit device as set forth in claim 14,
wherein said geometric area is at least 25 times larger than an area size of said minimum unit areas, and
wherein said geometric area is at most 400 times larger than the area size of said minimum unit areas.

16. The semiconductor integrated circuit device as set forth in claim 14,
wherein the area size of said geometric area is represented by a m×n matrix, and
wherein m and n are both within an integer range between 5 and 20.

* * * * *